United States Patent [19]
Hull

[11] Patent Number: 4,575,330
[45] Date of Patent: Mar. 11, 1986

[54] APPARATUS FOR PRODUCTION OF THREE-DIMENSIONAL OBJECTS BY STEREOLITHOGRAPHY

[75] Inventor: Charles W. Hull, Arcadia, Calif.

[73] Assignee: UVP, Inc., San Gabriel, Calif.

[21] Appl. No.: 638,905

[22] Filed: Aug. 8, 1984

[51] Int. Cl.⁴ .................... B29D 11/00; G03C 00/00
[52] U.S. Cl. .................. 425/174.4; 425/174; 425/162; 264/22; 430/269; 156/58; 365/119; 365/120
[58] Field of Search ................ 425/162, 174, 174.4, 425/425; 264/22, 183, 40.1; 430/269; 156/38, 58, 275.5; 365/107, 119, 127

[56] References Cited
U.S. PATENT DOCUMENTS

| | | | |
|---|---|---|---|
| 2,708,617 | 5/1955 | Magat et al. | 264/183 X |
| 2,908,545 | 10/1959 | Teja | 264/22 X |
| 3,306,835 | 2/1967 | Magnus | 425/174.4 X |
| 3,635,625 | 1/1972 | Voss | 425/162 X |
| 3,775,036 | 11/1973 | Winning | 425/174.4 |
| 3,974,248 | 8/1976 | Atkinson | 425/162 X |
| 4,041,476 | 8/1977 | Swainson | 365/119 |
| 4,078,229 | 3/1978 | Swainson et al. | 365/107 |
| 4,081,276 | 3/1978 | Crivello | 430/269 |
| 4,238,840 | 12/1980 | Swainson | 365/119 |
| 4,252,514 | 2/1981 | Gates | 425/162 |
| 4,288,861 | 9/1981 | Swainson et al. | 365/127 |
| 4,292,015 | 9/1981 | Hritz | 425/162 X |
| 4,329,135 | 5/1982 | Beck | 425/174 |
| 4,333,165 | 6/1982 | Swainson et al. | 365/127 X |
| 4,374,077 | 2/1983 | Kerfeld | 264/22 |
| 4,466,080 | 8/1984 | Swainson et al. | 365/127 X |
| 4,471,470 | 9/1984 | Swainson et al. | 365/127 |

Primary Examiner—J. Howard Flint, Jr.
Attorney, Agent, or Firm—Fulwider, Patton, Rieber, Lee & Utecht

[57] ABSTRACT

A system for generating three-dimensional objects by creating a cross-sectional pattern of the object to be formed at a selected surface of a fluid medium capable of altering its physical state in response to appropriate synergistic stimulation by impinging radiation, particle bombardment or chemical reaction, successive adjacent laminae, representing corresponding successive adjacent cross-sections of the object, being automatically formed and integrated together to provide a step-wise laminar buildup of the desired object, whereby a three-dimensional object is formed and drawn from a substantially planar surface of the fluid medium during the forming process.

47 Claims, 8 Drawing Figures

400# APPARATUS FOR PRODUCTION OF THREE-DIMENSIONAL OBJECTS BY STEREOLITHOGRAPHY

BACKGROUND OF THE INVENTION

This invention relates generally to improvements in apparatus for forming three-dimensional objects from a fluid medium and, more particularly, to stereolithography involving the application of lithographic techniques to production of three-dimensional objects, whereby such objects can be formed rapidly, reliably, accurately and economically.

It is common practice in the production of plastic parts and the like to first design such a part and then painstakingly produce a prototype of the part, all involving considerable time, effort and expense. The design is then reviewed and, oftentimes, the laborious process is again and again repeated until the design has been optimized. After design optimization, the next step is production. Most production plastic parts are injection molded. Since the design time and tooling costs are very high, plastic parts are usually only practical in high volume production. While other processes are available for the production of plastic parts, including direct machine work, vacuum-forming and direct forming, such methods are typically only cost effective for short run production, and the parts produced are usually inferior in quality to molded parts.

In recent years, very sophisticated techniques have been developed for generating three-dimensional objects within a fluid medium which is selectively cured by beams of radiation brought to selective focus at prescribed intersection points within the three-dimensional volume of the fluid medium. Typical of such three-dimensional systems are those described in U.S. Pat. Nos. 4,041,476, 4,078,229, 4,238,840 and 4,288,861. All of these systems rely upon the buildup of synergistic energization at selected points deep within the fluid volume, to the exclusion of all other points in the fluid volume, using a variety of elaborate multibeam techniques. In this regard, the various approaches described in the prior art include the use of a pair of electromagnetic radiation beams directed to intersect at specified coordinates, wherein the various beams may be of the same or differing wavelengths, or where beams are used sequentially to intersect the same points rather than simultaneously, but in all cases only the beam intersection points are stimulated to sufficient energy levels to accomplish the necessary curing process for forming a three-dimensional object within the volume of the fluid medium. Unfortunately, however, such three-dimensional forming systems face a number of problems with regard to resolution and exposure control. The loss of radiation intensity and image forming resolution of the focused spots as the intersections move deeper into the fluid medium create rather obvious complex control situations. Absorption, diffusion, dispersion and defraction all contribute to the difficulties of working deep within the fluid medium on any economical and reliable basis.

Yet there continues to be a long existing need in the design and production arts for the capability of rapidly and reliably moving from the design stage to the prototype stage and to ultimate production, particularly moving directly from computer designs for such plastic parts to virtually immediate prototypes and the facility for large scale production on an economical and automatic basis.

Accordingly, those concerned with the development and production of three-dimensional plastic objects and the like have long recognized the desirability for further improvement in more rapid, reliable, economical and automatic means which would facilitate quickly moving from a design stage to the prototype stage and to production, while avoiding the complicated focusing, alignment and exposure problems of the prior art three dimensional production systems. The present invention clearly fulfills all of these needs.

SUMMARY OF THE INVENTION

Briefly, and in general terms, the present invention provides a new and improved system for generating a three-dimensional object by forming successive, adjacent, cross-sectional laminae of that object at the surface of a fluid medium capable of altering its physical state in response to appropriate synergistic stimulation, the successive laminae being automatically integrated as they are formed to define the desired three-dimensional object.

In a presently preferred embodiment, by way of example and not necessarily by way of limitation, the present invention harnesses the principles of computer generated graphics in combination with stereolithography, i.e., the application of lithographic techniques to the production of three dimensional objects, to simultaneously execute computer aided design (CAD) and computer aided manufacturing (CAM) in producing three-dimensional objects directly from computer instructions. The invention can be applied for the purposes of sculpturing models and prototypes in a design phase of product development, or as a manufacturing system, or even as a pure art form.

"Stereolithography" is a method and apparatus for making solid objects by successively "printing" thin layers of a curable material, e.g., a UV curable material, one on top of the other. A programmed movable spot beam of UV light shining on a surface or layer of UV curable liquid is used to form a solid cross-section of the object at the surface of the liquid. The object is then moved, in a programmed manner, away from the liquid surface by the thickness of one layer, and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

Of course, it will be appreciated that other forms of appropriate synergistic stimulation for a curable fluid medium, such as particle bombardment (electron beams and the like), chemical reactions by spraying materials through a mask or by ink jets, or impinging radiation other than ultraviolet light, may be used in the practice of the invention without departing from the spirit and scope of the invention.

By way of example, in the practice of the present invention, a body of a fluid medium capable of solidification in response to prescribed stimulation is first appropriately contained in any suitable vessel to define a designated working surface of the fluid medium at which successive cross-sectional laminae can be generated. Thereafter, an appropriate form of synergistic stimulation, such as a spot of UV light or the like, is applied as a graphic pattern at the specified working surface of the fluid medium to form thin, solid, individual layers at that surface, each layer representing an adjacent cross-section of the three-dimensional object to be produced. Superposition of successive adjacent layers on each other is automatically accomplished, as they are formed, to integrate the layers and define the desired three-dimensional object. In this regard, as the fluid medium cures and solid material forms as a thin lamina at the working surface, a suitable platform to which the first lamina is secured is moved away from the working surface in a programmed manner by any appropriate actuator, typically all under the control of a micro-computer of the like. In this way, the solid material that was initially formed at the working surface is moved away from that surface and new liquid flows into the working surface position. A portion of this new liquid is, in turn, converted to solid material by the programmed UV light spot to define a new lamina, and this new lamina adhesively connects to the material adjacent to it, i.e., the immediately preceding lamina. This process continues until the entire three-dimensional object has been formed. The formed object is then removed from the container and the apparatus is ready to produce another object, either identical to the first object or an entirely new object generated by a computer or the like.

The stereolithographic apparatus of the present invention has many advantages over currently used apparatus for producing plastic objects. The apparatus of the present invention avoids the need of producing design layouts and drawings, and of producing tooling drawings and tooling. The designer can work directly with the computer and a stereolithographic device, and when he is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method of the invention becomes even more useful because all of the part designs can be quickly changed and made again so that the total assembly can be made and examined, repeatedly if necessary.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

Hence, the stereolithographic apparatus of the present invention satisfies a long existing need for a CAD and CAM system capable of rapidly, reliably, accurately and economically designing and fabricating three-dimensional plastic parts and the like.

The above and other objects and advantages of this invention will be apparent from the following more detailed description when taken in conjunction with the accompanying drawings of illustrative embodiments.

DESCRIPTION OF THE PREFERRED EMBODIMENT

Figure 1:
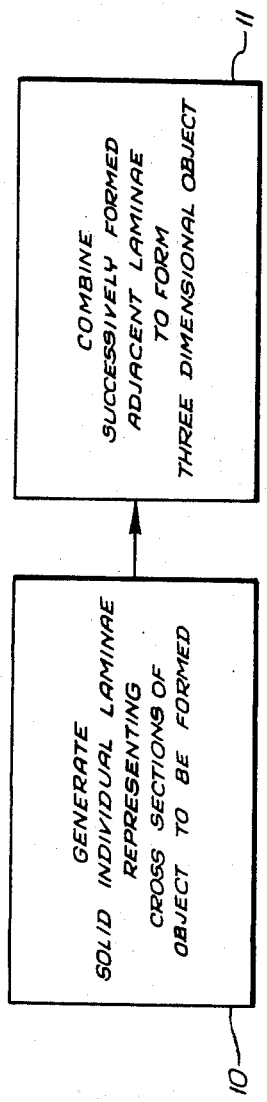
FIG. 1 and FIG. 2 are flow charts illustrating the basic concepts employed in practicing the method of stereolithography of the present invention.
Figure 2:
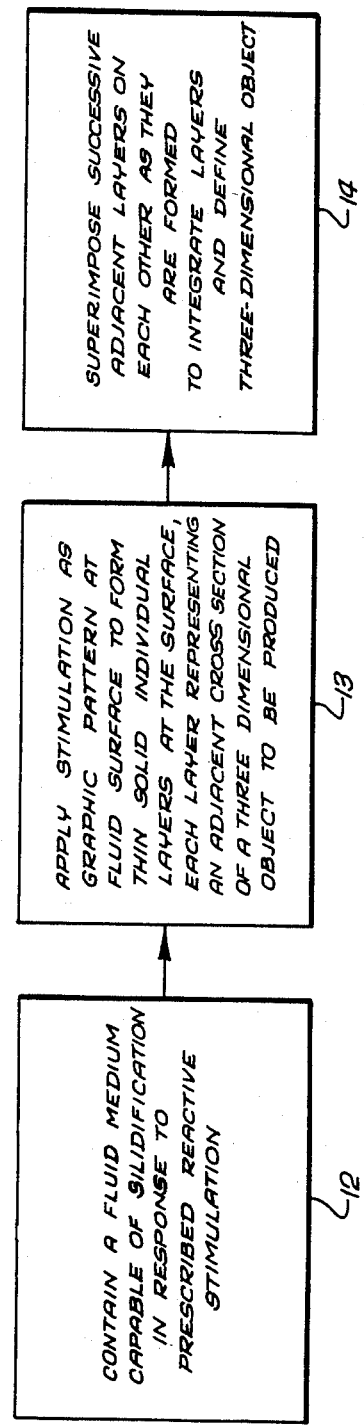

Referring now to the drawings, FIGS. 1 and 2 are flow charts illustrating the basic system of the present invention for generating three-dimensional objects by means of stereolithography.

Many liquid state chemicals are known which can be induced to change to solid state polymer plastic by irradiation with ultraviolet light (UV) or other forms of synergistic stimulation such as electron beams, visible or invisible light, reactive chemicals applied by ink jet or via a suitable mask. UV curable chemicals are currently used as ink for high speed printing, in processes of coating of paper and other materials, as adhesives, and in other specialty areas.

Lithography is the art of reproducing graphic objects, using various techniques. Modern examples include photographic reproduction, xerography, and microlithography, as is used in the production of microelectronics. Computer generated graphics displayed on a plotter or a cathode ray tube are also forms of lithography, where the image is a picture of a computer coded object.

Computer aided design (CAD) and computer aided manufacturing (CAM) are techniques that apply the abilities of computers to the processes of designing and manufacturing. A typical example of CAD is in the area of electronic printed circuit design, where a computer and plotter draw the design of a printed circuit board, given the design parameters as computer data input. A typical example of CAM is a numerically controlled milling machine, where a computer and a milling machine produce metal parts, given the proper programming instructions. Both CAD and CAM are important and are rapidly growing technologies.

A prime object of the present invention is to harness the principles of computer generated graphics, combined with UV curable plastic and the like, to simultaneously execute CAD and CAM, and to produce three-dimensional objects directly from computer instructions. This invention, referred to as stereolithography, can be used to sculpture models and prototypes in a design phase of product development, or as a manufacturing device, or even as an art form.

Referring now to FIG. 1, the stereolithographic method is broadly outlined. Step 10 in FIG. 1 calls for the generation of individual solid laminae representing cross-sections of a three-dimensional object to be formed. Step 11, which inherently occurs if Step 10 is performed properly, combines the successively formed adjacent laminae to form the desired three-dimensional object which has been programmed into the system for selective curing. Hence, the stereolithographic system of the present invention generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation, electron beam or other particle bombardment, or applied chemicals (as by ink jet or spraying over a mask adjacent the fluid surface), successive adjacent laminae, representing corresponding successive adjacent cross-sections of the object, being automatically formed and integrated together to provide a step-wise laminar or thin layer buildup of the object, whereby a three-dimensional object is formed and drawn from a substantially planar or sheet-like surface of the fluid medium during the forming process.

The aforedescribed technique is more specifically outlined in the flowchart of FIG. 2, wherein Step 12 calls for containing a fluid medium capable of solidification in response to prescribed reactive stimulation. Step 13 calls for application of that stimulation as a graphic pattern at a designated fluid surface to form thin, solid, individual layers at that surface, each layer representing an adjacent cross-section of a three-dimensional object to be produced. It is desirable to make each such layer as thin as possible during the practice of the invention in order to maximize resolution and the accurate reproduction of the three-dimensional object being formed. Hence, the ideal theoretical state would be an object produced only at the designated working surface of the fluid medium to provide an infinite number of laminae, each lamina having a cured depth of approximately only slightly more than zero thickness. Of course, in the practical application of the invention, each lamina will be a thin lamina, but thick enough to be adequately cohesive in forming the cross-section and adhering to the adjacent laminae defining other cross-sections of the object being formed.

Step 14 in FIG. 2 calls for superimposing successive adjacent layers or laminae on each other as they are formed, to integrate the various layers and define the desired three-dimensional object. In the normal practice of the invention, as the fluid medium cures and solid material forms to define one lamina, that lamina is moved away from the working surface of the fluid medium and the next lamina is formed in the new liquid which replaces the previously formed lamina, so that each successive lamina is superimposed and integral with (by virtue of the natural adhesive properties of the cured fluid medium) all of the other cross-sectional laminae. Hence, the process of producing such cross-sectional laminae is repeated over and over again until the entire three-dimensional object has been formed. The object is then removed and the system is ready to produce another object which may be identical to the previous object or may be an entirely new object formed by changing the program controlling the stereolithographic system.

FIGS. 3-8 of the drawings illustrate various apparatus suitable for implementing the stereolithographic methods illustrated and described by the flow charts of FIGS. 1 and 2.

As previously indicated, "Stereolithography" is a method and apparatus for making solid objects by successively "printing" thin layers of a curable material, e.g., a UV curable material, one on top of the other. A programmed movable spot beam of UV light shining on a surface or layer of UV curable liquid is used to form a solid cross-section of the object at the surface of the liquid. The object is then moved, in a programmed manner, away from the liquid surface by the thickness of one layer and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

Figure 3:
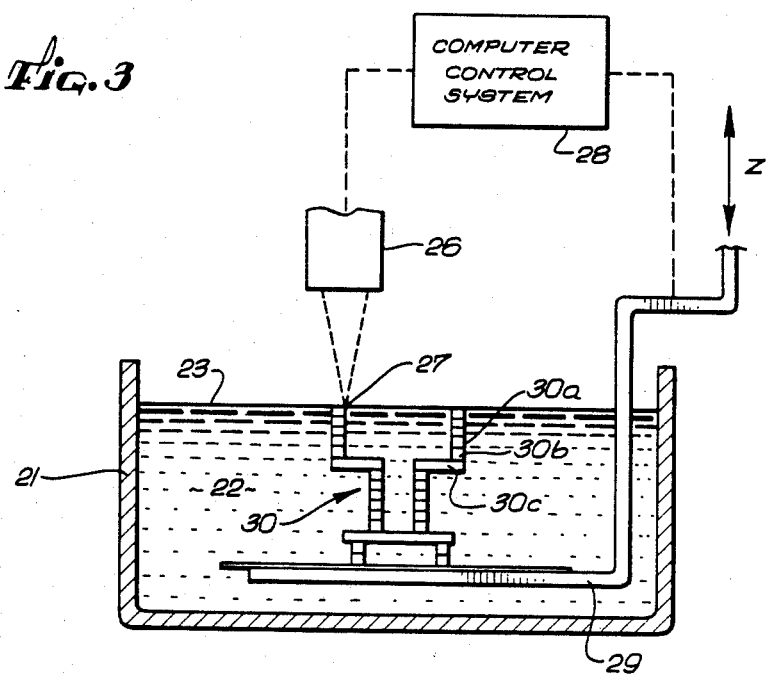
FIG. 3 is a combined block diagram, schematic and elevational sectional view of a presently preferred embodiment of a system for practicing the invention.

A presently preferred embodiment of the stereolithographic system is shown in elevational cross-section in FIG. 3. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown) that are a part of light source 26. The position of the spot 27 on surface 23 is controlled by a computer or other programming device 28. A movable elevator platform 29 inside container 21 can be moved up and down selectively, the position of the platform being controlled by the computer 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The curable liquid 22, e.g., UV curable liquid, must have several important properties. (A) It must cure fast enough with the available UV light source to allow practical object formation times. (B) It must be adhesive, so that successive layers will adhere to each other.

(C) Its viscosity must be low enough so that fresh liquid material will quickly flow across the surface when the elevator moves the object. (D) It should absorb UV so that the film formed will be reasonably thin. (E) It must be reasonably soluble in some solvent in the liquid state, and reasonably insoluble in that same solvent in the solid state, so that the object can be washed free of the UV cure liquid and partially cured liquid after the object has been formed. (F) It should be as non-toxic and non-irritating as possible.

The cured material must also have desirable properties once it is in the solid state. These properties depend on the application involved, as in the conventional use of other plastic materials. Such parameters as color, texture, strength, electrical properties, flammability, and flexibility are among the properties to be considered. In addition, the cost of the material will be important in many cases.

The UV curable material used in the presently preferred embodiment of a working stereolithograph (e.g., FIG. 3) is Potting Compound 363, a modified acrylate, made by Locktite Corporation of Newington, CT. A process to make a typical UV curable material is described in U.S. Pat. No. 4,100,141, entitled Stabilized Adhesive and Curing Compositions.

The light source 26 produces the spot 27 of UV light small enough to allow the desired object detail to be formed, and intense enough to cure the UV curable liquid being used quickly enough to be practical. The source 26 is arranged so it can be programmed to be turned off and on, and to move, such that the focused spot 27 moves across the surface 23 of the liquid 22. Thus, as the spot 27 moves, it cures the liquid 22 into a solid, and "draws" a solid pattern on the surface in much the same way a chart recorder or plotter uses a pen to draw a pattern on paper.

The light source 26 for the presently preferred embodiment of a stereolithograph is made using a 350 watt mercury short arc lamp in a housing, with the light output of the housing focused on the end of a 1 mm diameter UV transmitting fiber optic bundle (not shown). The end of the bundle next to the lamp is water cooled, and there is an electronically controlled shutter blade between the lamp and the end of the bundle, which can turn the light through the bundle on and off. The bundle is 1 meter long, and the optical output is fitted into a lens tube that has a quartz to focus the UV to a spot. The light source 26 is capable of producing a spot somewhat less than 1 mm in diameter, with a long wave UV intensity of about 1 watt/cm2.

In the system of FIG. 3, means may be provided to keep the surface 23 at a constant level and to replenish this material after an object has been removed, so that the focus spot 27 will remain sharply in focus on a fixed focus plane, thus insuring maximum resolution in forming a thin layer along the working surface. In this regard, it is desired to shape the focal point to provide a region of high intensity right at the working surface 23, rapidly diverging to low intensity and thereby limiting the depth of the curing process to provide the thinnest appropriate cross-sectional laminae for the object being formed. This is best accomplished by using a short focal length lens and bringing the source 26 as close as possible to the working surface, so that maximum divergence occurs in the cone of focus entering the fluid medium. The result is substantially enhanced resolution.

An H-P Model 9872 Digital Plotter (not shown) manufactured by Hewlett-Packard, of Palo Alto, Calif., is used to move the light source 26. The lens tube is attached to the pen carriage of the plotter, and the plotter is driven by a computer 28 using normal graphic commands. The shutter is controlled by an H-P 3497A Data Acquisition/Control Unit, using computer commands.

Other physical forms of the light source 26 or its equivalent are feasible. Scanning could be done with optical scanners, and this would eliminate the fiber optic bundle and the digital plotter. A UV laser might ultimately be a better light source than a short arc lamp. The speed of the stereolithographic process is mainly limited by the intensity of the light source and the response of the UV curable liquid.

The elevator platform 29 is used to support and hold the object 30 being formed, and to move it up and down as required. Typically, after a layer is formed, the object 30 is moved beyond the level of the next layer to allow the liquid 22 to flow into the momentary void at surface 23 left where the solid was formed, and then it is moved back to the correct level for the next layer. The requirements for the elevator platform 29 are that it can be moved in a programmed fashion at appropriate speeds, with adequate precision, and that it is powerful enough to handle the weight of the object 30 being formed. In addition, a manual fine adjustment of the elevator platform position is useful during the set-up phase and when the object is being removed.

The elevator platform 29 for the embodiment of FIG. 3 is a platform attached to an analog plotter (not shown). This plotter is driven the H-P 3497A Data Acquisition/Control Unit with its internal digital to analog converter, under program control of the computer 28.

The computer 28 in the stereolithographic system of the present invention has two basic functions. The first is to help the operator design the three-dimensional object in a way that it can be made. The second is to translate the design into commands that are appropriate for the other stereolithographic components, and to deliver these commands in a way so that the object is formed. In some applications, the object design will exist, and the only function of the computer will be to deliver the appropriate commands.

In an ideal situation, the operator will be able to design the object and view it three-dimensionally on the CRT screen of the computer 28. When he is finished with the design, he will instruct the computer 28 to make the object, and the computer will issue the appropriate instructions to the stereolithographic components.

In a present working embodiment of the invention, the computer 28 is an H-P 9816, using a Basic Operating System. A typical program is shown in Appendix A. In this system, the operator programs using H-P Graphic Language, the command structure for the 3497A, plus the Basic Language commands. The operator also must set the appropriate exposure times and rates for the UV curable material. To operate the system an image of the object is created and a program is written to drive the stereolithograph to make that object.

The elevator platform 29 can be mechanical, pneumatic, hydraulic, or electrical and may also use optical or electronic feedback to precisely control its position. The elevator platform 29 is typically fabricated of either glass or aluminum, but any material to which the cured plastic material will adhere is suitable.

In some cases, the computer 28 becomes unnecessary and simpler dedicated programming devices can be used, particularly where only simply shaped objects are to be formed. Alternatively, the computer control system 28 can be simply executing instructions that were generated by another, more complex, computer. This might be the case where several stereolithography units are used to produce objects, and another device is used to initially design the objects to be formed.

A computer controlled pump (not shown) may be used to maintain a constant level of the liquid 22 at the working surface 23. Appropriate level detection system and feedback networks, well known in the art, can be used to drive a fluid pump or a liquid displacement device, such as a solid rod (not shown) which is moved out of the fluid medium as the elevator platform is moved further into the fluid medium, to offset changes in fluid volume and maintain constant fluid level at the surface 23. Alternatively, the source 26 can be moved relative to the sensed level 23 and automatically maintain sharp focus at the working surface 23. All of these alternatives can be readily achieved by conventional software operating in conjunction with the computer control system 28.

After the three-dimensional object 30 has been formed, the elevator platform 29 is raised and the object is removed from the platform. Typically, the object is then ultrasonically rinsed in a solvent, such as acetone, that dissolves the liquid state of the uncured fluid medium and not the cured solid state medium. The object 30 is then placed under an intense ultraviolet floodlight, typically a 200 watt per inch UV cure lamp, to complete the curing process.

In addition, there may be several containers 21 used in the practice of the invention, each container having a different type of curable material that can be automatically selected by the stereolithographic system. In this regard, the various materials might provide plastics of different colors, or have both insulating and conducting material available for the various layers of electronic products.

Referring now more particularly to the remaining drawings, in connection with various alternative embodiments of the invention, like reference numerals throughout the various figures of the drawings denote like or corresponding parts as those previously discussed in connection with the preferred embodiment of the invention shown in FIG. 3.

Figure 4:
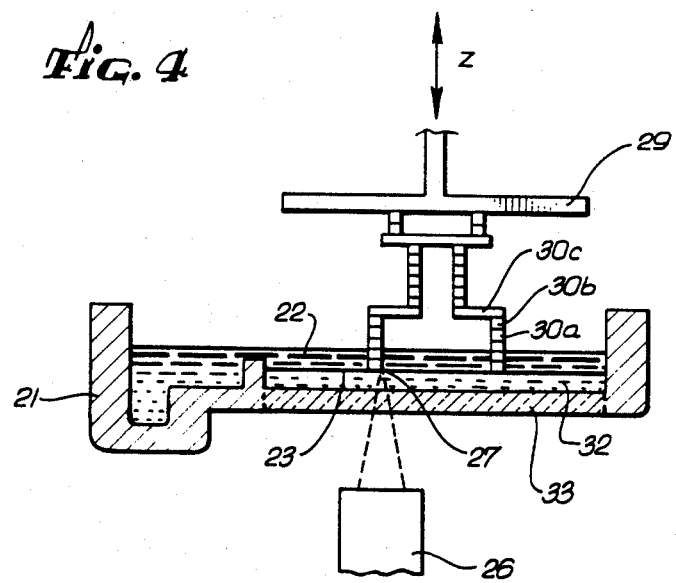
FIG. 4 is an elevational sectional view of a second embodiment of a stereolithography system for the practice of the invention.

As will be apparent from FIG. 4 of the drawings, there is shown an alternate configuration for a stereolithograph wherein the UV curable liquid 22 or the like floats on a heavier UV transparent liquid 32 which is non-miscible and non-wetting with the curable liquid 22. By way of example, ethylene glycol or heavy water are suitable for the intermediate liquid layer 32. In the system of FIG. 4, the three-dimensional object 30 is pulled up from the liquid 22, rather than down and further into the liquid medium, as shown in the system of FIG. 3.

The UV light source 26 in FIG. 4 focuses the spot 27 at the interface between the liquid 22 and the non-miscible intermediate liquid layer 32, the UV radiation passing through a suitable UV transparent window 33, of quartz or the like, supported at the bottom of the container 21. The curable liquid 22 is provided in a very thin layer over the non-miscible layer 32 and thereby has the advantage of limiting layer thickness directly, rather than relying solely upon adsorption and the like to limit the depth of curing, since ideally an ultrathin lamina is to be provided. Hence, the region of formation will be more sharply defined and some surfaces will be formed smoother with the system of FIG. 4 than with that of FIG. 3. In addition, a smaller volume of UV curable liquid 22 is required, and the substitution of one curable material for another is easier.

Figure 5:
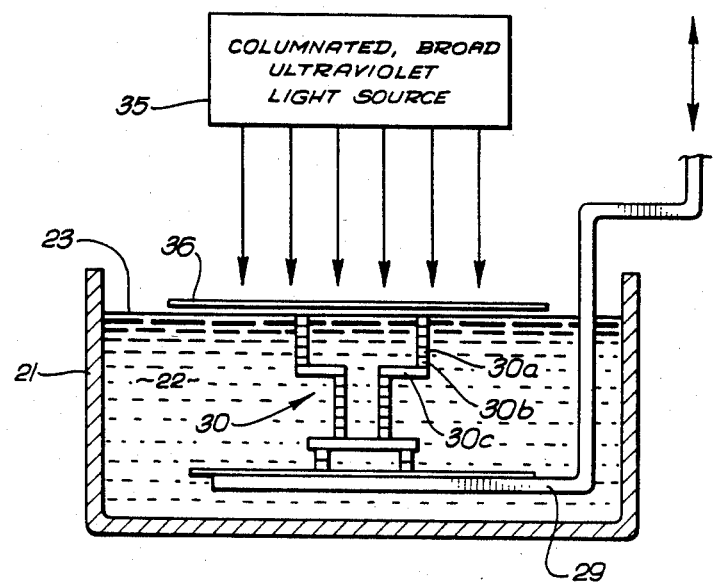
FIG. 5 is an elevational sectional view, illustrating a third embodiment of the present invention.
Figure 6:
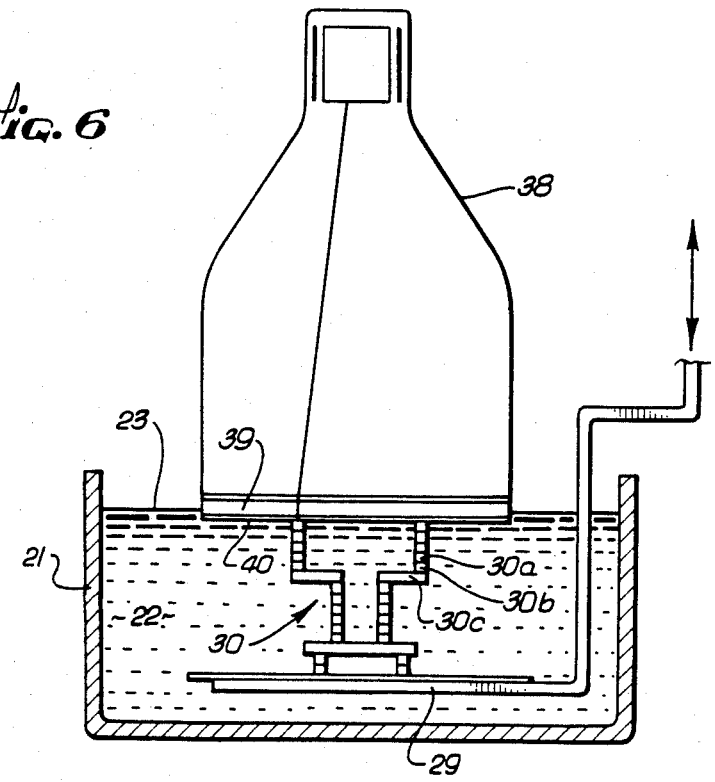
FIG. 6 is an elevational sectional view illustrating still another embodiment of the present invention.

The system of FIG. 5 is similar to that of FIG. 3, but the movable UV light source 26 is eliminated and a collimated, broad UV light source 35 and suitable apertured mask 36 is substituted for the programmed source 26 and focused spot 27. The apertured mask 36 is placed as close as possible to the working surface 23, and collimated light from the UV source 35 passes through the mask 36 to expose the working surface 23, thereby creating successive adjacent laminae, as in the embodiments of FIGS. 3 and 4. However, the use of a fixed mask 36 provides three-dimensional objects with a constant cross-sectional shape. Whenever that cross-sectional shape is to be changed, a new mask 36 for that particular cross-sectional shape must be substituted and properly aligned. Of course, the masks can be automatically changed by providing a web of masks (not shown) which are successively moved into alignment with with the surface 23.

FIG. 6 of the drawings again provides a stereolithographic system configuration similar to that previously described in connection with FIG. 3. However, a cathode ray tube (CRT) 38, fiber optic faceplate 39 and water (or other) release layer 40 are provided as a substitute for the light source 26 and focus spot 27. Hence, the graphic image provided by a computer 28 to the CRT 38 produces the forming image upon the UV emitting phosphor face of the tube where it passes through the fiber optic layer 39 and release layer 40 to the working surface 23 of the fluid medium 22. In all other respects, the system of FIG. 6 forms successive cross-sectional laminae defining the desired three-dimensional object to be formed, in exactly the same way as the embodiments of the invention previously discussed.

Figure 7:
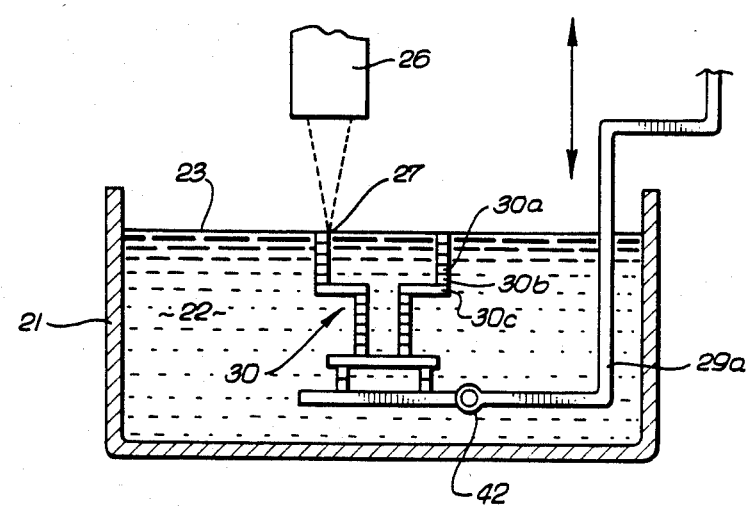
FIGS. 7 and 8 are partial, elevational sectional views, illustrating a modification of the stereolithographic system of FIG. 3 to incorporate an elevator platform with multiple degrees of freedom.
Figure 8:
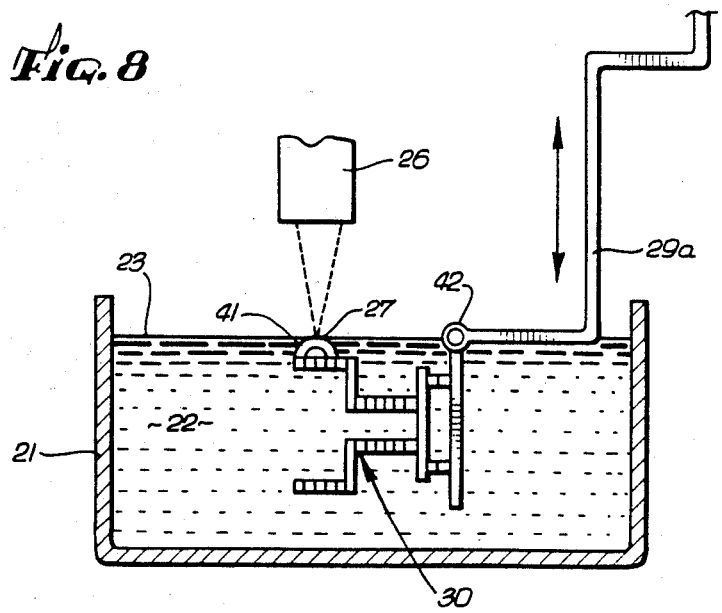

FIGS. 7 and 8 illustrate an embodiment of a stereolithographic system wherein the elevator platform 29 has additional degrees of freedom, so that different faces of the object 30 may be exposed for alternate methods of construction. Similarly, the stereolithography process may be utilized as an "add on" process where the elevator platform 29 will be used to pick up and locate another part for supplementary stereolithographic processing. In this regard, the systems shown in FIGS. 7 and 8 are identical to that of FIG. 3 with the exception of the elevator platform 29 which, in the systems of FIGS. 7 and 8 have a second degree of freedom via manual or automatically controlled rotation about a pivot pin or hinge member 42. In this regard, FIG. 7 illustrates an adjustable elevator platform 29a in the conventional position, while FIG. 8 shows the platform 29a rotated 90° so that a supplementary, stereolithographically formed structure 41 can be selectively formed as an addition to one side of the three-dimensional object 30.

A commercial stereolithography system will have additional components and subsystems besides those previously shown in connection with the schematically depicted systems of FIGS. 3–8. For example, the commercial system would also have a frame and housing, and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks. Such commercial units will also have means to effectively shield the sensitive electronics from electronic noise sources.

As previously mentioned, a number of other possible apparatus may be utilized to practice the stereolithographic method. For example, an electron source, a visible light source, or an x-ray source or other radiation source could be substituted for the UV light source 26, along with appropriate fluid media which are cured in response to these particular forms of reactive stimulation. For example, alphaoctadecylacrylic acid that has been slightly prepolymerized with UV light can be polymerized with an electron beam. Similarly, poly(2,3-dichloro-1-propyl acrylate) can be polymerized with an x-ray beam.

The stereolithographic method and apparatus has many advantages over currently used methods for producing plastic objects. The method avoids the need of producing design layouts and drawings, and of producing tooling drawings and tooling. The designer can work directly with the computer and a stereolithographic device, and when he is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

It will be apparent from the foregoing that, while a variety of stereolithographic systems have been disclosed for the practice of the present invention, they all have in common the concept of drawing upon a substantially two-dimensional surface and extracting a three-dimensional object from that surface.

The present invention satisfies a long existing need in the art for a CAD and CAM system capable of rapidly, reliably, accurately and economically designing and fabricating three-dimensional plastic parts and the like.

It will be apparent from the foregoing that, while particular forms of the invention have been illustrated and described, various modifications can be made without departing from the spirit and scope of the invention.

Accordingly, it is not intended that the invention be limited, except as by the appended claims.

I claim:

1. A system for producing a three-dimensional object from a fluid medium capable of solidification when subjected to prescribed synergistic stimulation, said system comprising:

means for drawing upon and forming successive cross-sectional laminae of said object at a two-dimensional interface; and means for moving said cross-sections as they are formed and building up said object in step wise fashion, whereby a three-dimensional object is extracted from a substantially two-dimensional surface.

2. An improved system for producing a three-dimensional object from a fluid medium capable of solidification when subjected to prescribed synergistic stimulation, said system comprising:

a body of fluid medium capable of transforming its physical state in response to synergistic stimulation;

object support means immersed within said fluid medium for supporting a three-dimensional object to be formed;

translational means for selectively moving said object support means progressively away from a designated surface of said fluid medium; and reaction means capable of altering the physical state of said fluid medium and operating in a prescribed pattern upon said designated surface of said fluid medium to provide a thin solid lamina at said surface representing a corresponding cross-sectional lamina of said three-dimensional object to be formed, whereby successive adjacent laminae are provided to form said three-dimensional object on said object support means as said translational means moves said support means away from said designated surface.

3. A system as set forth in claim 2, and further including:

programmed control means for varying the graphic pattern of said reaction means operating upon said designated surface of said fluid medium.

4. A system as set forth in claim 2, wherein said reaction means includes:

a beam of impinging radiation.

5. A system as set forth in claim 2, wherein said reaction means includes:

an electron beam.

6. A system as set forth in claim 2, wherein said reaction means includes:

a beam of high energy particles.

7. A system as set forth in claim 2, wherein said reaction means includes:

a beam of light.

8. A system as set forth in claim 2, wherein said reaction means includes:

x-rays.

9. A system as set forth in claim 2, wherein said reaction means includes:

a beam of ultraviolet light.

10. A system as set forth in claim 2, wherein said reaction means includes:

a jet of a reactive chemical to induce solidification of said fluid medium.

11. A system as set forth in claim 2, wherein said reaction means includes:

a patterned mask overlying said designated surface for selectively applying a chemical to induce solidification of said fluid medium.

12. A system as set forth in claim 2, wherein said reaction means includes:
a patterned mask overlying said designated surface for selectively exposing said surface to synergistic stimulation.

13. A system as set forth in claim 2, wherein said reaction means includes:
a patterned mask overlying said designated surface for selectively exposing said surface to radiation.

14. A system as set forth in claim 2, wherein said translational means moves said object as it is formed away from said designated surface and further into said fluid medium.

15. A system as set forth in claim 2, wherein said translational means moves said object as it is formed away from said surface and out of said fluid medium.

16. A system as set forth in claim 2, wherein exposure to said reaction means at said designated surface is through a second non-reactive medium.

17. A system as set forth in claim 2, and further including:
a container for said fluid medium, wherein exposure of said designated surface to said reaction means is through the bottom of said container and a second non-reactive medium adjacent said designated surface.

18. A system as set forth in claim 17, wherein said second non-reactive medium is heavy water.

19. A system as set forth in claim 17, wherein said second non-reactive medium is ethylene glycol.

20. A system as set forth in claim 2, and further including:
rotational means, supplementing said translational means for altering the orientation of said object relative to said designated surface at which laminae are being formed.

21. A system as set forth in claim 2, wherein the level of said fluid medium locating said designated surface is variable.

22. A system as set forth in claim 2, wherein the level of said fluid medium locating said designated surface is maintained constant.

23. A system as set forth in claim 2, wherein said translational means has multiple degrees of freedom of movement.

24. A system as set forth in claim 4, wherein precise focus of said beam of impinging radiation upon said designated surface is maintained.

25. A system as set forth in claim 2, wherein said prescribed pattern is formed upon said designated surface by radiation emanating from the face of a cathode ray tube.

26. A system as set forth in claim 2, wherein said prescribed pattern is formed by light directly emanating from a phosphor image.

27. A system for directly producing a three-dimensional object as it is designed by a computer, comprising:
deriving graphic image output from said computer, said graphic image defining successive adjacent cross-sections of the three-dimensional object designed by said computer;
means for drawing upon and forming successive cross-sections, corresponding to said computer designed cross-sections of said object, at a two-dimensional interface; and
means for moving said cross-sections as they are formed and building up said object in a stepwise fashion, whereby the three-dimensional object designed by said computer is automatically extracted from a substantially two-dimensional surface.

28. An improved system for producing a three-dimensional object from a fluid medium capable of altering its physical state when subjected to prescribed radiation, said system comprising:
a body of fluid medium capable of altering its physical state;
means for forming said three-dimensional object from said fluid medium by irradiating a designated surface of said medium to provide integrated, successive surface laminae at said surface, said laminae together defining said three-dimensional object.

29. An improved system for producing a three-dimensional object from a fluid medium, said system comprising:
a body of fluid medium capable of altering its physical state in response to prescribed radiation;
a radiation source for impinging said prescribed radiation in a selected pattern upon a designated surface of said fluid medium to provide only at said surface a thin solid lamina representing a cross-sectional lamina of a three-dimensional object to be formed; and
means for combining successive adjacent laminae to form said three-dimensional object from said fluid medium.

30. A system as set forth in claim 29, wherein said radiation source includes:
a beam of impinging radiation.

31. A system as set forth in claim 29, wherein said radiation source includes:
an electron beam.

32. A system as set forth in claim 29, wherein said radiation source includes:
a beam of high energy particles.

33. A system as set forth in claim 29, wherein said radiation source includes:
a beam of light.

34. A system as set forth in claim 29, wherein said radiation source includes:
a beam of ultraviolet light.

35. A system as set forth in claim 29, wherein said radiation source includes:
x-rays.

36. A system as set forth in claim 29, wherein said radiation source and pattern includes:
a patterned mask overlying said designated surface for selectively exposing said surface to synergistic stimulation.

37. A system as set forth in claim 29, wherein said radiation source and pattern includes:
a patterned mask overlying said designated surface selectively exposing said surface to radiation.

38. A system as set forth in claim 29, wherein exposure to said prescribed radiation at said designated surface is through a second non-reactive medium.

39. A system as set forth in claim 29, and further including:
a container for said fluid medium, wherein exposure of said designated surface to said prescribed radiation is through the bottom of said container and a second non-reactive medium adjacent said designated surface.

40. A system as set forth in claim 39, wherein said second non-reactive medium is heavy water.

41. A system as set forth in claim 39, wherein said second non-reactive medium is ethylene glycol.

42. A system as set forth in claim 39, wherein the level of said fluid medium locating said designated surface is maintained constant.

43. A system as set forth in claim 39, wherein said translational means has multiple degrees of freedom of movement.

44. A system as set forth in claim 39, wherein precise focus of said prescribed radiation upon said designated surface is maintained.

45. A system as set forth in claim 39, wherein said selected pattern is formed upon said designted surface by radiation emanating from the face of a cathode ray tube.

46. A system as set forth in claim 39, wherein said selected pattern is formed by light directly emanating from a phosphor image.

47. A system as set forth in claim 39, and further including:
   programmed control means for varying the pattern of said impinging radiation upon said designated surface of said fluid medium.

* * * * *

REEXAMINATION CERTIFICATE (1177th)
United States Patent [19]
Hull

[11] B1 4,575,330
[45] Certificate Issued Dec. 19, 1989

[54] APPARATUS FOR PRODUCTION OF THREE-DIMENSIONAL OBJECTS BY STEREOLITHOGRAPHY

[75] Inventor: Charles W. Hull, Arcadia, Calif.

[73] Assignee: UVP, Inc.

Reexamination Request:
No. 90/001,611, Sep. 28, 1988

Reexamination Certificate for:
Patent No.: 4,575,330
Issued: Mar. 11, 1986
Appl. No.: 638,905
Filed: Aug. 8, 1984

[51] Int. Cl.⁴ .................... B29C 35/08; G03C 9/08
[52] U.S. Cl. .................... 425/174.4; 156/58; 264/22; 365/119; 365/120; 425/162; 425/174
[58] Field of Search .................... 425/162, 174, 174.4, 425/425; 264/22, 40.1, 25, 219, 183, 250, 255, 298, 308; 365/107, 119, 127, 106, 120; 156/58, 246, 273.3, 273.5, 275.5; 250/432 R, 433, 492.3, 492.1, 558; 522/910; 430/269, 296, 942; 342/179; 427/53.1, 54.1, 55

[56] References Cited

U.S. PATENT DOCUMENTS

| | | | |
|---|---|---|---|
| 2,381,234 | 8/1945 | Symmes | 430/294 |
| 2,525,532 | 10/1950 | Dreywood | 430/419 |
| 2,708,617 | 5/1955 | Magat et al. | 264/183 X |
| 2,775,758 | 12/1956 | Munz | 342/179 |
| 2,908,545 | 10/1959 | Teja | 264/22 X |
| 3,306,835 | 2/1967 | Magnus | 425/174.4 X |
| 3,428,503 | 2/1969 | Beckerle | 430/269 |
| 3,609,707 | 9/1971 | Lewis et al. | 365/119 |
| 3,635,625 | 1/1972 | Voss | 425/162 X |
| 3,723,120 | 3/1973 | Hummel | 522/910 X |
| 3,775,036 | 11/1973 | Winning | 425/174.4 |
| 3,866,052 | 2/1975 | Di Matteo | 250/558 |
| 3,932,923 | 1/1976 | Di Matteo | 29/407 |
| 3,974,248 | 8/1976 | Atkinson | 425/162 X |
| 4,041,476 | 8/1977 | Swainson | 365/119 |
| 4,078,229 | 3/1978 | Swainson et al. | 365/107 |
| 4,081,276 | 3/1978 | Crivello | 430/269 |
| 4,100,141 | 7/1978 | O'Sullivan | 526/301 |
| 4,238,840 | 12/1980 | Swainson | 365/119 |
| 4,247,508 | 1/1981 | Housholder | 264/219 |
| 4,252,514 | 2/1981 | Gates | 425/162 |
| 4,288,861 | 9/1981 | Swainson et al. | 365/127 |
| 4,292,015 | 9/1981 | Hritz | 425/162 X |
| 4,329,135 | 5/1982 | Beck | 425/174 |
| 4,333,165 | 6/1982 | Swainson et al. | 365/127 X |
| 4,374,077 | 2/1983 | Kerfield | 264/22 |
| 4,466,080 | 8/1984 | Swainson et al. | 365/127 X |
| 4,471,470 | 9/1984 | Swainson et al. | 365/127 |

FOREIGN PATENT DOCUMENTS

| | | |
|---|---|---|
| 1917294 | 4/1969 | Fed. Rep. of Germany . |
| 2553039 | 4/1985 | France . |
| 144478 | 11/1981 | Japan . |
| 58-211413 | 12/1983 | Japan . |
| 566795 | 1/1945 | United Kingdom . |
| 1556451 | 11/1979 | United Kingdom . |
| 2035602 | 6/1980 | United Kingdom . |

OTHER PUBLICATIONS

H. Kodama, "Automatic Method for Fabricating a Three-Dimensional Plastic Model with Photo-Hardening Polymer," Review of Scientific Instruments, vol 52, No. 11, Nov. 1981, pp. 1770–1773.

A. J. Herbert, "Solid Object Generation," Journal of Applied Photographic Engineering, 8(4), Aug. 1982, pp. 185–188.

H. Kodama, "A Scheme for Three-Dimensional Display by Automatic Fabrication of Three-Dimensional Model," IECE, vol. J64–C, No. 4, Apr. 1981, pp. 237–241.

Request for Reexamination of U.S. Patent No. 4,575,330 filed Sep. 27, 1988, by E. I. Du Pont de Nemours & Company.

*Primary Examiner*—Richard L. Chiesa

[57] ABSTRACT

A system for generating three-dimensional objects by creating a cross-sectional pattern of the object to be formed at a selected surface of a fluid medium capable of altering its physical state in response to appropriate synergistic stimulation by impinging radiation, particle bombardment or chemical reaction, successive adjacent laminae, representing corresponding successive adjacent cross-sections of the object, being automatically formed and integrated together to provide a step-wise laminar buildup of the desired object, whereby a three-dimensional object is formed and drawn from a substantially planar surface of the fluid medium during the forming process.

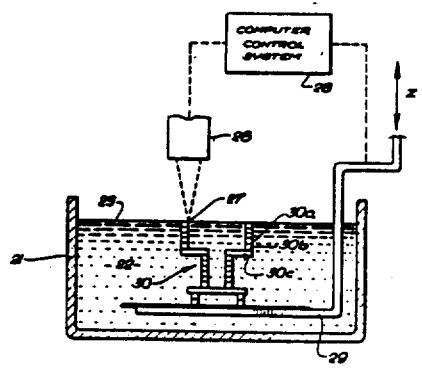

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2 and 27–29 are determined to be patentable as amended.

Claims 3–26 and 30–47, dependent on an amended claim, are determined to be patentable.

1. A system for producing a three-dimensional object from a fluid medium capable of solidification when subjected to prescribed synergistic stimulation, said system comprising:
   a container holding said fluid medium, said medium being sufficiently absorptive of solidifying radiation to enable formation of an adequately cohesive layer of structure capable of being partially unsupported by any other layer of structure during formation;
   means for drawing upon and forming successive cross-sectional laminae of said object at a two-dimensional interface [and] of said fluid medium defining a designated working surface, said laminae including a first cross-sectional layer of structure at said working surface;
   means for automatically recoating over the entire said first cross-sectional layer of structure with a body of fluid and decreasing a substantial portion of said body of fluid in thickness from a fluid layer of excess fluid thickness to a successive fluid layer of less thickness in preparation for formation of a second cross-sectional layer of structure adhered to said first cross-sectional layer; and
   means for moving said [cross-sections] cross-sectional layers as they are formed and building up said object from a plurality of successively adhered layers of structure in step wise fashion, whereby a three-dimensional object is extracted from a substantially two-dimensional surface.

2. An improved system for producing a three-dimensional object from a fluid medium capable of solidification when subjected to prescribed synergistic stimulation, said system comprising:
   a body of fluid medium capable of transforming its physical state in response to synergistic stimulation, said fluid medium being sufficiently absorptive of said synergistic stimulation to enable formation of an adequately cohesive lamina of structure capable of being partially unsupported by any other lamina during formation;
   object support means immersed within said fluid medium for supporting a three-dimensional object to be formed;
   translational means for selectively moving said object support means progressively away from a designated working surface of said fluid medium; [and]
   reaction means capable of altering the physical state of said fluid medium and operating in a prescribed pattern upon said designated working surface of said fluid medium to provide a thin, solid, first cross-sectional lamina of structure at said working surface representing a corresponding cross-sectional lamina of said three-dimensional object to be formed [.]; and
   means for automatically recoating over the entire said first cross-sectional lamina of structure with a body of fluid and decreasing a substantial portion of said body of fluid in thickness from a fluid layer of excess fluid thickness to a successive fluid layer of less thickness in preparation for formation of a second cross-sectional lamina of structure adhered to said first cross-sectional lamina of structure, whereby [successive] a plurality of successively adjacent adhered laminae are provided to form said three-dimensional object on said object support means as said translational means moves said support means away from said designated working surface.

27. A system for directly producing a three-dimensional object as it is designed by a computer, comprising:
   deriving graphic image output from said computer, said graphic image output defining successive adjacent cross-sections of the three-dimensional object designed by said computer;
   a container holding a fluid medium capable of solidification, said fluid medium being sufficiently absorptive of solidifying radiation to enable formation of an adequately cohesive layer of structure capable of being partially unsupported by any other layer of structure during formation;
   means for drawing upon and forming successive layer cross-sections, corresponding to said computer designed cross-sections of said object, at a two-dimensional interface [and] of said fluid medium defining a working surface, said layer cross-sections including a first cross-sectional layer of structure at said working surface;
   means for automatically recoating over the entire said first cross-sectional layer of structure with a body of fluid and decreasing a substantial portion of said body of fluid in thickness from a fluid layer of excess fluid thickness to a successive fluid layer of less thickness in preparation for formation of a second cross-sectional layer of structure adhered to said first cross-sectional layer; and
   means for moving said [cross-sections] cross-sectional layers as they are formed and building up said object from a plurality of successively adhered layers in a stepwise fashion, whereby the three-dimensional object designed by said computer is automatically extracted from a substantially two-dimensional surface.

28. An improved system for producing a three-dimensional object from a fluid medium capable of altering its physical state when subjected to prescribed radiation, said system comprising:
   a body of fluid medium capable of altering its physical state, said fluid medium defining a designated working surface and being sufficiently absorptive of solidifying radiation to enable formation of an adequately cohesive layer of structure capable of being partially unsupported by any other layer of structure during formation;

means for forming said three-dimensional object from said fluid medium by irradiating [a] *said* designated *working* surface of said *fluid* medium to provide integrated, successive surface laminae at said *working surface,* said laminae together defining said three-dimensional object[.], *said laminae including a first cross-sectional layer of structure at said working surface; and*

*means for automatically recoating over the entire said first cross-sectional layer of structure with a body of fluid and decreasing a substantial portion of said body of fluid in thickness from a fluid layer of excess fluid thickness to a successive fluid layer of less thickness in preparation for formation of a second cross-sectional layer of structure adhered to said first cross-sectional layer, whereby a plurality of successively adhered layers of structure form said three-dimensional object.*

29. An improved system for producing a three-dimensional object from a fluid medium, said system comprising:

a body of fluid medium capable of altering its physical state in response to prescribed radiation, *said fluid medium being sufficiently absorptive of said prescribed radiation to enable formation of an adequately cohesive lamina of structure capable of being partially unsupported by any other lamina of structure during formation;* a radiation souce for impinging said prescribed radiation in a selected pattern upon a designated *working* surface of said fluid medium to provide only at said *working* surface a thin, solid, *first cross-sectional* lamina *of structure* representing a cross-sectional lamina of a three-dimensional object to be formed; [and]

*means for automatically recoating over the entire said first cross-sectional lamina of structure with a body of fluid and decreasing a substantial portion of said body of fluid in thickness from a fluid layer of excess fluid thickness to a successive fluid layer of less thickness in preparation for formation of a second cross-sectional lamina of structure adhered to said first cross-sectional lamina of structure; and* means for combining [successive] *a plurality of successively adhered* adjacent laminae *of structure* to form said three-dimensional object from said fluid medium.

* * * * *